US012641908B2

(12) United States Patent
Xu et al.

(10) Patent No.: US 12,641,908 B2
(45) Date of Patent: May 26, 2026

(54) TOPCon CELL, METHOD FOR MANUFACTURING THE SAME, AND ELECTRICAL DEVICE

(71) Applicant: TONGWEI SOLAR (MEISHAN) CO., LTD., Sichuan (CN)

(72) Inventors: Wenzhou Xu, Meishan (CN); Hao Chen, Meishan (CN); Mingzhang Deng, Meishan (CN); Yu He, Meishan (CN); Fan Zhou, Meishan (CN); Guoqiang Xing, Meishan (CN); Qian Yao, Meishan (CN)

(73) Assignee: TONGWEI SOLAR (MEISHAN) CO., LTD., Meishan (CN)

( * ) Notice: Subject to any disclaimer, the term of this patent is extended or adjusted under 35 U.S.C. 154(b) by 595 days.

(21) Appl. No.: 18/043,407

(22) PCT Filed: Jul. 26, 2022

(86) PCT No.: PCT/CN2022/107913
§ 371 (c)(1),
(2) Date: Feb. 28, 2023

(87) PCT Pub. No.: WO2023/071329
PCT Pub. Date: May 4, 2023

(65) Prior Publication Data
US 2024/0395963 A1 Nov. 28, 2024

(30) Foreign Application Priority Data
Oct. 26, 2021 (CN) .......................... 202111248983.7

(51) Int. Cl.
*H10F 71/00* (2025.01)
*H10F 10/14* (2025.01)
*H10F 10/166* (2025.01)

(52) U.S. Cl.
CPC ....... *H10F 71/1221* (2025.01); *H10F 10/146* (2025.01); *H10F 10/166* (2025.01); (Continued)

(58) Field of Classification Search
CPC ............. H01L 31/1804; H01L 31/1872; H01L 31/068; H01L 31/0745; H01L 31/182; (Continued)

(56) References Cited

U.S. PATENT DOCUMENTS 7,670,966 B2 * 3/2010 Dubois ............... H10F 71/1215
438/58
11,804,564 B2 * 10/2023 Qu .......................... H10F 19/85
(Continued)

FOREIGN PATENT DOCUMENTS

CN 102487106 A 6/2012
CN 105870215 A 8/2016
(Continued)

OTHER PUBLICATIONS

Australian Office Action for corresponding Application No. 2022331906, dated Feb. 20, 2024, 7 pages.
(Continued)

*Primary Examiner* — Earl N Taylor
(74) *Attorney, Agent, or Firm* — Dority & Manning, PA

(57) ABSTRACT

A method for manufacturing a TOPCon cell includes following steps: texturing a front side of an silicon wafer and then preparing a PN junction; forming a tunnel oxide layer, an intrinsic polysilicon layer, a doped polysilicon layer, and a silicon oxide mask layer in sequence on a back side of the silicon wafer, wherein the tunnel oxide layer is deposited by PEALD at a deposition temperature of 150° C. to 200° C., the doped polysilicon layer is deposited by PECVD, and the silicon oxide mask layer has a thickness of 10 nm to 40 nm; removing a wraparound silicon oxide mask layer material (Continued)

and a wraparound polysilicon layer material from the front side of the silicon wafer, and then removing the silicon oxide mask layer from the back side; and forming a front electrode on the PN junction and a back electrode on the doped polysilicon layer, respectively.

18 Claims, 1 Drawing Sheet

(52) U.S. Cl.
CPC ....... *H10F 71/1274* (2025.01); *H10F 71/129* (2025.01); *H10F 71/131* (2025.01)

(58) Field of Classification Search
CPC ............. H01L 31/0682; H01L 31/0747; H01L 31/1848; H01L 31/1868; H10F 71/1221; H10F 10/146; H10F 10/166; H10F 71/1274; H10F 71/129; H10F 71/131; H10F 10/14; H10F 71/121; H10F 10/165; Y02E 10/547; Y02P 70/50
See application file for complete search history.

(56) References Cited

U.S. PATENT DOCUMENTS

| | | | | |
|---|---|---|---|---|
| 2009/0253225 | A1* | 10/2009 | Dubois | H01L 21/3242 257/E31.127 |
| 2021/0217907 | A1 | 7/2021 | Chen et al. | |
| 2022/0238748 | A1* | 7/2022 | Chen | H10F 71/129 |

FOREIGN PATENT DOCUMENTS

| | | | |
|---|---|---|---|
| CN | 110571304 | A | 12/2019 |
| CN | 110690297 | A | 1/2020 |
| CN | 110911503 | A | 3/2020 |
| CN | 110911505 | A | 3/2020 |
| CN | 110931604 | A | 3/2020 |
| CN | 111081810 | A | 4/2020 |
| CN | 111128697 | A | 5/2020 |
| CN | 111640823 | A | 9/2020 |
| CN | 111834493 | A | 10/2020 |
| CN | 111987182 | A | 11/2020 |
| CN | 112310231 | A | 2/2021 |
| CN | 112542521 | A | 3/2021 |
| CN | 213357746 | U | 6/2021 |
| CN | 113122827 | A | 7/2021 |
| CN | 113445050 | A | 9/2021 |
| CN | 113540293 | A | 10/2021 |
| CN | 113972302 | A | 1/2022 |
| TW | 202118079 | A | 5/2021 |

OTHER PUBLICATIONS

Extended European Search Report for corresponding Application No. 22859514.6, dated Apr. 23, 2024, 8 pages.
H. Yousuf et al., "A Review on TOPCon Solar Cell Technology", Current Photovoltaic Research 9(3), Sungkyunkwan University, Korea, 2021, p. 75-83.
N. Nandakumar et al., "Approaching 23% with large-area monopoly cells using screen-printed and fired rear passivating contacts fabricated by inline PECVD", Progress in Photovoltaics: Research and Applications, vol. 27, Issue 2, Dec. 2018, 7 pages.
H. Chang et al., "Poly-Si Passivated Solar Cells Fabricated by Firing Contact Metallization With the Shallow Silver Penetration", 36th European Photovoltaic Solar Energy Conference and Exhibition, Taiwan, p. 575-579.
PCT International Search Report and Written Opinion for corresponding PCT Application No. PCT/CN2022/107913, mailed Sep. 28, 2022, 10 pages.
Chinese First Office Action for corresponding Chinese Application No. 202111248983.7, dated Feb. 14, 2023, 13 pages.

* cited by examiner

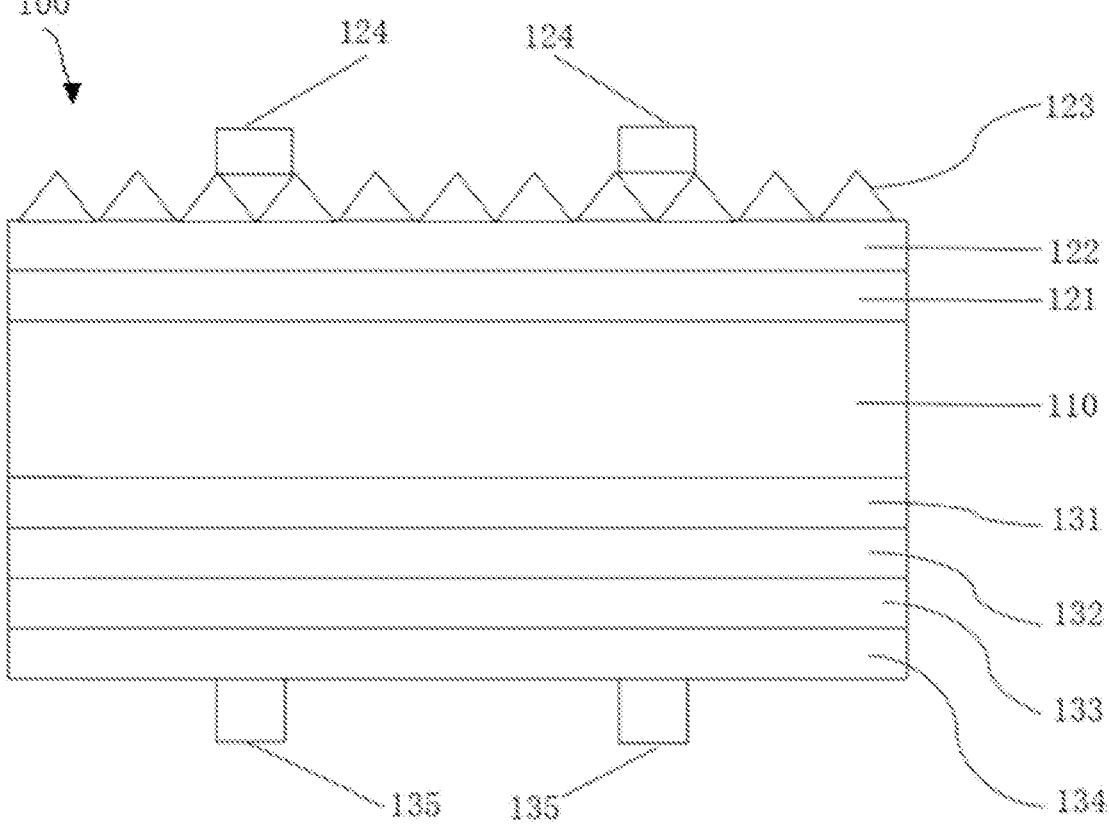

TOPCon CELL, METHOD FOR MANUFACTURING THE SAME, AND ELECTRICAL DEVICE

This application is a US national phase application of International Patent Application No. PCT/CN2022/107913, filed Jul. 26, 2022, which, in turn, claims priority to Chinese Patent Application No. 2021112489837, filed on Oct. 26, 2021 with Chinese patent office, entitled "TOPCon CELL, METHOD FOR MANUFACTURING THE SAME, AND ELECTRICAL DEVICE", the contents of both of which are hereby incorporated by reference herein in their entirety.

TECHNICAL FIELD

The present application relates to the technical field of cells, and in particular to a TOPCon cell, a method for manufacturing the same, and an electrical device.

BACKGROUND

Tunnel oxide passivated contact (TOPCon) cells are solar cells using an ultrathin oxide layer as a passivation layer structure. The breakthrough experimental progress of the TOPCon cells was reported by Frank Feldmann et.al. from the Fraunhofer ISE Institute in Germany in 2013. The key of this technology involves firstly forming a 1.4 nm tunnel oxide layer of $SiO_2$ by oxidizing a back side of an N-type silicon substrate with high concentration $HNO_3$ through a chemical wet oxidation method, and then depositing a phosphorus-doped $n^+$-poly-Si film. After high temperature annealing, an ultrathin tunnel oxide layer and a phosphorus-doped polysilicon film are formed, which collectively constitute a passivated contact structure. Such a structure provides the back side of the silicon wafer with a good surface passivation, which effectively decreases the recombination current density at the back side and increases the photoelectric conversion efficiency of the cells.

In 2020, by having the poly-Si film formation, the selective emitter (SE) technology, and the cell structure optimized, the Fraunhofer ISE Institute, Germany, manufactured a small area solar cell with a breakthrough in efficiency to 26.0%, which is higher than the average efficiency (22.8%-23.2%) of the current mainstream PERC cells. This shows that the TOPCon solar cells can significantly increase the photoelectric conversion efficiency of solar cells, and thus can increase the output power and decrease the levelized cost of electricity (LCOE) of power stations. In addition, the TOPCon cells adopt the N-type silicon wafer which has a long bulk lifetime because of the absence of boron-oxygen complex. The silicon wafer has a low level of metal impurities, a low light-induced degradation (LID) rate, and a low light and elevated temperature induced degradation (LeTID) rate. The poly-Si allows passivated metal contact, and Voc>705 mV. The back side of the cells has a micro-textured structure, with the bifaciality rate of about 90%. According to the outdoor test performed by TUV NORD Germany, in contrast to the mainstream PERC cell products, the power generation gain of a bifacial TOPCon cell is 14.3%, and the power generation gain of a monofacial TOPCon cell is 5.0%. Therefore, the TOPCon cell technology has high value for industrialization and power generation.

In mass production of the TOPCon cells, the main technical route involves low-pressure chemical vapor deposition (LPCVD) for depositing a tunnel oxide layer and an amorphous silicon film, and involves ion injection or phosphorus diffusion to dope the amorphous silicon film for forming phosphorus-doped polysilicon. In regard to the ion injection technique, the cells need to undergo a RCA wet-cleaning process to remove metal impurities introduced from the ion injection before the annealing step which activates the phosphorus atoms in the poly-Si film and repairs the damage caused by the ion injection. In regard to the phosphorus diffusion technique, the wraparound deposition formed in the diffusion process and the wraparound deposition of the poly-Si film formed in the LPCVD deposition may cause whitening of appearance of the cells and darkening in the electroluminescence (EL) tests, which significantly affects the yield. In addition, the method is complicated and the process window is relatively narrow.

SUMMARY

In view of this, there is a need to provide a TOPCon cell, a method for manufacturing the same, and an electrical device.

The present application is realized by the technical solutions as follows.

An aspect of the present application provides a method for manufacturing a TOPCon cell, including following steps:

texturing a front side of an N-type silicon wafer and then preparing a PN junction;

forming a tunnel oxide layer, an intrinsic polysilicon layer, a doped polysilicon layer, and a silicon oxide mask layer in sequence on a back side of the silicon wafer, wherein the tunnel oxide layer is deposited by PEALD at a deposition temperature of 150° C. to 200° C., the doped polysilicon layer is deposited by PECVD, and the silicon oxide mask layer has a thickness of 10 nm to 40 nm;

removing a wraparound silicon oxide mask layer material and a wraparound polysilicon layer material from the front side of the silicon wafer, and then removing the silicon oxide mask layer from the back side; and forming a front electrode on the PN junction and a back electrode on the doped polysilicon layer, respectively.

In some embodiments, the intrinsic polysilicon layer is deposited by PECVD.

In some embodiments, the tunnel oxide layer, the intrinsic polysilicon layer, and the doped polysilicon layer are formed by depositing the tunnel oxide layer, an intrinsic amorphous silicon film, and a doped amorphous silicon film in sequence in a same deposition chamber of a same tubular deposition device and then annealing the same.

In some embodiments, the intrinsic polysilicon layer and the silicon oxide mask layer are deposited by PECVD.

In some embodiments, the tunnel oxide layer, the intrinsic polysilicon layer, the doped polysilicon layer, and the silicon oxide mask layer are formed by depositing the tunnel oxide layer, an intrinsic amorphous silicon film, a doped amorphous silicon film, and the silicon oxide mask layer in sequence in a same deposition chamber of a same tubular deposition device, and then annealing the same.

In some embodiments, the annealing is performed at 600° C. to 1000° C. for 10 min to 60 min under a nitrogen or oxygen atmosphere.

In some embodiments, the silicon oxide mask layer is deposited by introducing $SiH_4$ and $N_2O$ as reactant sources, a flow ratio of $SiH_4$ to $N_2O$ is 1:6 to 1:10, and a deposition temperature is 350° C. to 500° C.

In some embodiments, the step of forming the intrinsic polysilicon layer, the doped polysilicon layer, and the silicon oxide mask layer includes:

depositing an intrinsic amorphous silicon film and a doped amorphous silicon film in sequence on the tunnel oxide layer by PECVD, and then annealing the same under an oxygen atmosphere to transform the intrinsic amorphous silicon film into the intrinsic polysilicon layer and to transform an inner layer and an outer layer of the doped amorphous silicon film respectively into the doped polysilicon layer and the silicon oxide mask layer;

wherein the annealing is performed at 600° C. to 1000° C. for 10 min to 60 min.

In some embodiments, the intrinsic amorphous silicon film is deposited by introducing a carrier gas and $SiH_4$, a flow rate ratio of $SiH_4$ to the carrier gas is 1:6 to 1:8, and a deposition temperature is 350° C. to 500° C.

In some embodiments, the doped amorphous silicon film is deposited by introducing a carrier gas, $SiH_4$, and $PH_3$, a flow rate ratio of $SiH_4$ to $PH_3$ to the carrier gas is 1:(2 to 3):(4 to 6), and a deposition temperature is 350° C. to 500° C.

In some embodiments, the tunnel oxide layer is deposited by introducing an organosilicone source and oxygen gas as reactant sources, a flow rate ratio of the organosilicone source to the oxygen gas is 1:2 to 1:3, and a deposition pressure is 100 Pa to 150 Pa.

In some embodiments, a thickness of the tunnel oxide layer is 0.5 nm to 2 nm.

In some embodiments, a thickness of the intrinsic polysilicon layer is 10 nm to 50 nm.

In some embodiments, a thickness of the doped polysilicon layer is 80 nm to 150 nm.

In some embodiments, the silicon oxide mask layer on the back side is removed by acid pickling with an acid liquid, and the acid liquid contains hydrofluoric acid with a volume percent of 8% to 15%.

In some embodiments, the PN junction is prepared by boron diffusion during which a boron-doped silicon layer is formed in the silicon wafer and a borosilicate glass layer is formed on a surface of the boron-doped silicon layer; the borosilicate glass layer is removed simultaneously with the removal of the silicon oxide mask layer from the back side;

a thickness of the borosilicate glass layer formed on the surface of the PN junction is 100 nm to 120 nm;

a thickness of the silicon oxide mask layer is 20 nm to 30 nm.

In some embodiments, the wraparound silicon oxide mask layer material on the front side of the silicon wafer is removed by acid pickling with an acid liquid, and the acid liquid contains hydrofluoric acid with a volume percent of 10% to 40%.

In some embodiments, the step of removing the wraparound polysilicon layer material from the front side of the silicon wafer is performed after the removal of the wraparound silicon oxide mask layer material from the front side of the silicon wafer;

the wraparound polysilicon layer material on the front side of the silicon wafer is removed by alkaline pickling with an alkaline liquid, the alkaline liquid is a solution containing sodium hydroxide, potassium hydroxide, or a combination thereof, and a mass concentration of the alkaline liquid is 3% to 6%.

In some embodiments, before the step of forming the front electrode on the PN junction, the method further includes a step of forming a front passivation layer and an anti-reflection layer in sequence on the PN junction;

the front passivation layer is an aluminum oxide film, and the anti-reflection layer is a silicon nitride film.

In some embodiments, before the step of forming the back electrode on the doped polysilicon layer, the method further includes a step of forming a back passivation layer on the doped polysilicon layer, the back passivation layer is a silicon nitride film.

Another aspect of the present application provides a TOPCon cell, manufactured by any one of above-described manufacturing methods.

Another aspect of the present application provides an electrical device, including the above-described TOPCon cell.

The details of one or more embodiments of the present application are shown in the following accompany drawings and description. The additional features, objectives, and advantages of the present application will be apparent from the description, the accompany drawings, and the claims.

BRIEF DESCRIPTION OF THE DRAWINGS

In order to better describe and illustrate embodiments and/or examples of the present application, reference may be made to one or more accompanying drawings. The additional details or examples used to describe the accompanying drawings should not be considered as limitations to the scope of any of the disclosed application, the presently described embodiments and/or examples, and the presently understood best modes of the invention.

FIG. 1 is a schematic structural view of a TOPCon cell in Example 1 of the present application.

| Reference Signs: | | |
|---|---|
| 100, TOPCon cell; | |
| 110, N-type silicon wafer; | 121, boron-doped silicon layer; |
| 122, front passivation layer; | 123, anti-reflection layer; |
| 124, front electrode; | 131, tunnel oxide layer; |
| 132, intrinsic polysilicon layer; | 133, doped polysilicon layer; |
| 134, back passivation layer; | 135, back electrode. |

DETAILED DESCRIPTION

In order to facilitate understanding of the present application, the present application will be comprehensively described with reference to the accompanying drawings. However, the present application can be implemented in many different forms and therefore is not limited to the embodiments described herein. It should be understood that the purpose of providing these embodiments is to thoroughly and comprehensively understand the disclosure of the present application.

In addition, the terms such as "first" and "second" are merely used for descriptive purposes, and should not be construed as indicating or implying relative importance or implying the quantity or the sequence of described technical features. Thus, the features limited by "first" and "second" may explicitly or implicitly include at least one of these features. In the description of the present application, "a plurality of" means at least two, for example, two, three, or more, unless specified otherwise.

Unless otherwise defined, all the technical and scientific terms used herein have the same meaning as those commonly understood by a person skilled in the art to which the present application belongs. The terms as used in the description of the present application are merely for the purpose of describing specific examples of, and without limiting, the present application.

A TOPCon cell and a method for manufacturing the same are provided in embodiments of the present application. Hereinafter, the manufactured TOPCon cell will be specifically described in combination with the description of the method for manufacturing the TOPCon cell.

An embodiment of the present application provides a method for manufacturing a TOPCon cell, including following steps S1 to S5.

Step S1, texture a front side of an N-type silicon wafer and then prepare a PN junction.

Step S2, sequentially form a tunnel oxide layer, an intrinsic polysilicon layer, a doped polysilicon layer, and a silicon oxide mask layer on a back side of the silicon wafer. The tunnel oxide layer is deposited by plasma-enhanced atomic layer deposition (PEALD) at a deposition temperature of 150° C. to 200° C. The doped polysilicon layer is deposited by plasma-enhanced chemical vapor deposition (PECVD). The silicon oxide mask layer has a thickness of 10 nm to 40 nm.

Step S3, remove a wraparound silicon oxide mask layer material and a wraparound polysilicon layer material from the front side of the silicon wafer, and then remove the silicon oxide mask layer from the back side.

Step S4, form a front electrode on the PN junction on the front side of the silicon wafer.

Step S5, form a back electrode on the doped polysilicon layer on the back side of the silicon wafer.

It is to be understood that the sequential order of the steps S4 and S5 is not limited herein.

In the above-described manufacturing method of the TOPCon cell, a deposition technology combining PEALD with PECVD is adopted. Specifically, the tunnel oxide layer is deposited by PEALD at the specific deposition temperature, and the doped polysilicon layer is deposited by PECVD. As compared to the LPCVD deposition technology, PEALD has a lower deposition temperature and less wraparound phenomenon, and does not have the problem of metal impurities introduced by ion injection. In addition, the silicon oxide mask layer with the specific thickness formed on the doped polysilicon layer can well protect the doped polysilicon layer on the back side from being damaged during removal of the wraparound polysilicon layer material from the front side of the silicon wafer. The silicon oxide mask layer with such thickness can be easily removed, and thus the front electrode and the back electrode can be easily respectively formed on the PN junction and the doped polysilicon layer to obtain the TOPCon cell. The manufacturing method is simple in the process, offers advantages in controlling the appearance and yield, can boost yield while ensuring a relatively high photoelectric conversion efficiency and open-circuit voltage, which makes the method better suited for mass production.

In some embodiments, the intrinsic polysilicon layer is deposited by PECVD.

Further, an intrinsic amorphous silicon film and a doped amorphous silicon film can be deposited in sequence in a same deposition chamber of a same tubular deposition device and then annealed to form the intrinsic polysilicon layer and the doped polysilicon layer. Alternatively, the tunnel oxide layer, the intrinsic amorphous silicon film, and the doped amorphous silicon film can be deposited in sequence in a same deposition chamber of a same tubular deposition device and then annealed to form the tunnel oxide layer, the intrinsic polysilicon layer, and the doped polysilicon layer. As such, without having to take the wafer out from the chamber, the deposition of a subsequent layer can be carried out right before termination of the deposition of a previous layer, preventing damage or contamination to the films or layers in the process of unloading and loading the wafer in the midway. This not only simplifies the manufacture, reduces processing time and increases utilization of the deposition device, but also improves passivation performance of the manufactured TOPCon cell and thereby increases the efficiency of the cell.

It can be understood that in the deposition process, different types of gases according to actual needs may be introduced alternately or simultaneously into the chamber.

Further, a frequency of a radio frequency (RF) power supply used in each deposition step can be 40 kHz, 200 kHz, or 400 kHz, which can be selected arbitrarily.

Further, it has been found in the study that the higher the frequency of the RF power supply used in the deposition, the greater the number of commutations of ion orientation, the shorter the ion acceleration time, the lower the deposition speed, the longer the deposition time, and the less the damage to the films or layers on the substrate, while higher the valence of the ions, the greater the binding energy, and the better the deposition uniformity, which is conducive to improving the uniformity of the films or layers.

In some embodiments, the thickness of the tunnel oxide layer is 0.5 nm to 2 nm. The ultrathin tunnel oxide layer enables the tunneling of the majority carriers, i.e., electrons, into the phosphorus-doped polysilicon thin layer while blocking the recombination of the minority carriers, i.e., holes, so that electrons are transversely transported in the polysilicon layer and collected by the metal, thereby greatly reducing the recombination current density under the metal contacts, increasing the open-circuit voltage and short-circuit current of the cell, and increasing the photoelectric conversion efficiency of the cell.

Further, the thickness of the intrinsic polysilicon layer is from 10 nm to 50 nm. The intrinsic polysilicon layer, which is the transitional layer between the tunnel oxide layer and the doped polysilicon layer, should not be too thick in order to avoid impeding the transfer of photogenerated carriers.

Further, the thickness of the doped polysilicon layer is from 80 nm to 150 nm.

In some embodiments, the intrinsic polysilicon layer and the silicon oxide mask layer are formed by PECVD.

Further, the tunnel oxide layer, the intrinsic amorphous silicon film, the doped amorphous silicon film, and the silicon oxide mask layer are deposited in sequence in a same deposition chamber of a same tubular deposition device and then annealed to form the tunnel oxide layer, the intrinsic polysilicon layer, the doped polysilicon layer, and the silicon oxide mask layer. The annealing step allows the intrinsic amorphous silicon film and the doped amorphous silicon film to be respectively transformed into the intrinsic polysilicon layer and the doped polysilicon layer.

As such, the four film depositing steps for forming the tunnel oxide layer, the intrinsic polysilicon layer, the doped polysilicon layer, and the silicon oxide mask layer are combined in the same deposition chamber followed by a single annealing step, which further reduces the processing time, increases the deposition speed, and facilitates the industrialized production and use.

Further, the annealing step is performed at 600° C. to 1000° C. for 10 min to 60 min under a nitrogen or oxygen atmosphere. Since the silicon oxide mask layer on the doped amorphous silicon film can protect the doped amorphous silicon film from being oxidized into silicon oxide in the annealing step, the annealing step can be carried out under the oxygen atmosphere.

Further, the silicon oxide mask layer is deposited by introducing $SiH_4$ and $N_2O$ as reactant sources. The flow ratio of $SiH_4$ to $N_2O$ is 1:6 to 1:10, and the deposition temperature is 350° C. to 500° C.

In some other embodiments, the silicon oxide mask layer is not directly formed by the PECVD deposition method, and the intrinsic polysilicon layer, the doped poly silicon layer, and the silicon oxide mask layer are formed by the following steps:

deposit an intrinsic amorphous silicon film and a doped amorphous silicon film in sequence on the tunnel oxide layer by PECVD, and then anneal the same under an oxygen atmosphere to transform the intrinsic amorphous silicon film into the intrinsic polysilicon layer and to transform an inner layer and an outer layer of the doped amorphous silicon film respectively into the doped polysilicon layer and the silicon oxide mask layer, wherein the annealing step is carried out at 600° C. to 1000° C. for 10 min to 60 min.

That is to say, in this embodiment, without the step of depositing the silicon oxide mask layer by PECVD, the silicon oxide mask layer is obtained by controlling the conditions of the annealing step. Under the oxygen atmosphere, the inner layer of the doped amorphous silicon film is transformed into the doped polysilicon layer, while the outer layer is oxidized into the silicon oxide mask layer.

Further, the intrinsic amorphous silicon film is deposited by introducing a carrier gas and $SiH_4$. The flow rate ratio of $SiH_4$ to the carrier gas is 1:6 to 1:8, and the deposition temperature is 350° C. to 500° C. Furthermore, the carrier gas is selected from $H_2$, Ar, or a combination thereof.

It can be understood that the above-described silicon wafer of the TOPCon cell is the N-type silicon wafer, the doped amorphous silicon film is an N-type doped amorphous silicon film, and the doped polysilicon layer is an N-type doped polysilicon layer. Further, the doped amorphous silicon film is a phosphorus-doped amorphous silicon film, and the doped polysilicon layer is a phosphorus-doped polysilicon layer.

Further, the doped amorphous silicon film is deposited by introducing a carrier gas, $SiH_4$, and $PH_3$. The flow rate ratio of $SiH_4$ to $PH_3$ to the carrier gas is 1:(2 to 3):(4 to 6), and the deposition temperature is 350° C. to 500° C. Furthermore, the carrier gas is selected from $H_2$, Ar, or a combination thereof. The concentration of the doped phosphorus can be controlled by controlling the flow rate ratio of $SiH_4$ to $PH_3$ to the carrier gas.

Further, the deposition temperature of the tunnel oxide layer is 150° C. to 180° C. Furthermore, the deposition temperatures of the intrinsic amorphous silicon film, the doped amorphous silicon film, and the silicon oxide mask layer are independently 350° C. to 400° C.

Further, the tunnel oxide layer is a tunnel silicon dioxide layer. The tunnel oxide layer is deposited by introducing an organosilicone source and oxygen gas as reactant sources. The flow rate ratio of the organosilicone source to the oxygen gas is 1:2 to 1:3, and the deposition pressure is 100 Pa to 150 Pa. Furthermore, the organosilicone source can be tri(dimethylamino) silane, 3-amino propyl trimethoxy silane, or a combination thereof.

In some embodiments, the wraparound silicon oxide mask layer material on the front side of the silicon wafer is removed by acid pickling. The acid liquid used in the acid pickling contains hydrofluoric acid with a volume percent of 10% to 40%, and in some embodiments, 20% to 30%. More specifically, the acid pickling is performed by using a continuous-type apparatus for pickling with hydrofluoric acid (HF), so it only comes into contact with the front side of the silicon wafer, in order to remove the wraparound silicon oxide mask layer material from the front side without removing the silicon oxide mask layer from the back side. In addition, phosphorosilicate glass (PSG) which is formed from the wraparound layer on the front side in the annealing step can also be removed in this acid pickling step.

In some embodiments, the wraparound polysilicon layer material on the front side of the silicon wafer is removed by alkaline pickling. The alkaline liquid used in the alkaline pickling is a solution containing sodium hydroxide, potassium hydroxide, or a combination thereof. A mass concentration of the alkaline liquid is 3% to 6%. Specifically, the alkaline pickling step is performed in an alkaline bath.

In some embodiments, the silicon oxide mask layer on the back side is removed by acid pickling. The acid liquid used in the acid pickling contains hydrofluoric acid with the volume percent of 8% to 15%. Specifically, the acid pickling step is performed in an acid bath.

Further, the PN junction is prepared by boron diffusion. The silicon wafer is subjected to the boron diffusion to form a boron-doped silicon layer. A borosilicate glass layer is formed on the surface of the boron-doped silicon layer due to the oxidation at the high diffusion temperature, wherein the boron-doped silicon layer is a P-type doped layer which forms the PN junction with the N-type silicon wafer.

Further, the boron diffusion is carried out by introducing $BCl_3$ and oxygen gas at 900° C. to 1050° C. to form the PN junction. The ratio of $BCl_3$ to the oxygen gas is 1:8 to 1:20. The volume percent of $BCl_3$ in the atmosphere is 1% to 3%.

The borosilicate glass layer on the front side can be removed simultaneously with the removal of the silicon oxide mask layer on the back side. As such, the silicon oxide mask layer on the back side and the borosilicate glass layer on the front side can be removed at the same time in the acid bath. In addition, to check whether the silicon oxide mask layer on the back side and the borosilicate glass layer on the front side of the product obtained in this step are completely removed, a common procedure is to check one surface only, and if the checked surface is qualified, then both the silicon oxide mask layer and the borosilicate glass layer are considered as being completely removed. Therefore, it is preferable to keep the removing speed of the silicon oxide mask layer on the back side and that of the borosilicate glass layer on the front side consistent in the acid bath, so as to avoid uncleanness at one surface, which will increase the resistance, and to avoid overcleaning at one surface as well.

Further, the borosilicate glass layer formed on the surface of the PN junction is made of boron-containing silicon dioxide, which has a relatively loose structure, and can be quickly removed by acid pickling. Whereas, the silicon oxide mask layer is made of high-purity silicon dioxide, which has a relatively dense structure, and has a low removing speed by acid pickling. It has been found in the study that under the above-described acid pickling conditions, the borosilicate glass layer formed on the surface of the PN junction has a thickness of 100 nm to 120 nm and the silicon oxide mask layer has a thickness of 20 nm to 30 nm, which require substantially the same time for removal.

In some embodiments, after step S1 and before step S2, the method further includes a step of removing a wraparound film or layer generated due to the boron diffusion, such as a borosilicate glass layer, from the back side of the silicon wafer. Specifically, the boron diffusion wraparound film or layer on the back side of the silicon wafer is removed by acid pickling. The acid liquid used in the acid pickling is HF solution with a volume percent of 40% to 80%. The high concentration of the HF solution can reduce the acid pick-ling time. After the step of removing the boron diffusion wraparound film or layer from the back side of the silicon wafer, the PN junctions formed on the back side and edges of the silicon wafer are also removed by using an alkaline solution. In addition, a pyramidical textured structure of 0.3 μm to 3 μm, specifically 0.3 μm to 1 μm, is formed on the back side of the silicon wafer.

In some embodiments, before the step of forming the front electrode on the PN junction, the method further includes steps of forming a front passivation layer and forming an anti-reflection layer in sequence on the PN junction.

Further, the front passivation layer is an aluminum oxide film. The anti-reflection layer is a silicon nitride film. Furthermore, the front passivation layer is deposited by PEALD or ALD. The anti-reflection layer is deposited by PECVD. Further, in the deposition of the aluminum oxide film by ALD, trimethylaluminum (TMA) and water ($H_2O$) or ozone ($O_3$) can be used as reactants.

In some embodiments, before the step of forming the back electrode on the doped polysilicon layer, the method further includes a step of forming a back passivation layer on the doped polysilicon layer.

Further, the back passivation layer is a silicon nitride film. Furthermore, the back passivation layer is deposited by PECVD.

Another aspect of the present application provides an electrical device, including the above-described TOPCon cell. The TOPCon cell can provide electricity to the elec-trical device.

In some embodiments, the electrical device includes, but is not limited to, the transportation equipment such as the automobile and the airplane, in-car aromatherapy product, and other electrical devices driven by the electricity.

The present application will be described with reference to the following specific examples in order to make the objects, technical solutions, and advantages of the present application more concise and clear, but the present applica-tion is by no means limited to those examples. The following described examples are only embodiments of the present application, which can be used to illustrate the present application, but should not be construed as limiting the scope of the present application. It should be noted that any modifications, alternatives, and improvements made within the spirits and principles of the present application shall fall within the protection scope of the present application.

The present application will be further described with reference to examples hereinafter in order to better under-stand the present application. The specific examples are described as below.

Example 1

Referring to FIG. 1, a TOPCon cell 100 includes a silicon wafer 110, which is a N-type silicon substrate; a boron-doped silicon layer 121, a front passivation layer 122, an anti-reflection layer 123, and a front electrode 124 are stacked in sequence on a front side of the silicon wafer 110; and a tunnel oxide layer 131, an intrinsic polysilicon layer 132, a doped polysilicon layer 133, a back passivation layer 134, and a back electrode 135 are stacked in sequence on a back side of the silicon wafer 110.

A method for manufacturing the TOPCon cell mainly includes the following steps:

(1) Texturing on the front side: first use a hydrogen peroxide solution with a concentration of 2% by vol-ume and an alkaline liquid with a concentration of 0.3% by mass to clean the oil stains on the surface of the silicon wafer 110, and then form the texture by using an alkaline liquid with a concentration of 1% by mass to slow the reaction rate. A pyramidical textured structure is formed on the surface of the silicon wafer 110 to reduce reflection of lights.

(2) Boron diffusion on the front side: put the cleaned and dried silicon wafer 110 into a boron diffusion furnace and introduce $BCl_3$ and oxygen gas at 1008° C. to form the boron-doped silicon layer 121, thereby obtaining the PN junction. The ratio of $BCl_3$ to the oxygen gas is 1:15. The volume percent of $BCl_3$ in the atmosphere in the furnace tube is 1.4%. After the high temperature diffusion, a borosilicate glass layer (BSG, not shown in FIG. 1) with a thickness of 120 nm and a sheet resistance of 80 Ω/sq to 150 Ω/sq is produced on the surface of the silicon wafer.

(3) Alkaline polishing on the back side: remove the wraparound BSG formed in the boron diffusion from the back side of the boron-diffused silicon wafer by using a continuous-type apparatus for pickling with HF in a volume percent of 75%; then pass the silicon wafer into an alkaline polishing trough via a mechanical arm; and then remove the PN junction formed on the back side and on edges of the silicon wafer by using an alkaline liquid with a mass concentration of 2% added with an alkaline polishing additive; form a micro-textured structure of 0.3 μm to 1 μm on the back side of the silicon wafer.

(4) Formation of the tunnel oxide layer and the polysili-con passivation layer on the back side: deposit a tunnel oxide layer 131 by tubular PEALD, and deposit an intrinsic polysilicon film (i-poly-Si), a doped polysili-con film ($n^+$-poly-Si), and a silicon dioxide ($SiO_2$) mask layer by PECVD. The four films are deposited in the same furnace tube that is kept sealed, by using the RF power supply with a frequency of 200 kHz for all the four film depositions.

The first film/layer (tunnel oxide layer, $SiO_2$): introduce an organosilicone source and oxygen gas ($O_2$) as reactant sources to deposit a thin silicon oxide layer as the tunnel oxide layer on the surface of the silicon wafer under the electrical action of a RF electric field by PEALD. The thickness of the tunnel oxide layer 131 is 1.2 nm. The organosilicon source is dimethylamino silane. The flow rate ratio of the organosilicon source to the oxygen gas is 1:2.1. The deposition pressure is 120 Pa, and the deposition temperature is 180° C.

The second film/layer (intrinsic amorphous silicon film): introduce $SiH_4$ and $H_2$ to deposit the intrinsic amorphous silicon film with a thickness of 20 nm by PECVD. The ratio of $SiH_4$ to $H_2$ is 1:7.0, and the deposition temperature is 380° C.

The third film/layer (doped amorphous silicon film): introduce $SiH_4$, $PH_3$, and $H_2$ to deposit the phosphorus-doped amorphous silicon film with a thickness of 120 nm by PECVD. A ratio of $SiH_4$ to $PH_3$ to $H_2$ is 1:2:2.5, and the deposition temperature is 380° C.

The fourth film/layer (silicon dioxide ($SiO_2$) mask layer): introduce $SiH_4$ and $N_2O$ to deposit a $SiO_2$ wet etching mask layer with a thickness of 20 nm by PECVD, in order to protect the doped polysilicon layer to be formed in the annealing step from being damaged when removing the wraparound layer. The ratio of $SiH_4$ to $N_2O$ is 1:8, and the deposition temperature is 380° C.

(5) Annealing: anneal the sample obtained in the step (4) in a tubular annealing furnace at a temperature of 920° C. for 45 min under nitrogen atmosphere, thereby transforming crystal structures of the deposited intrinsic amorphous silicon film and doped amorphous silicon film from amorphous silicon into polysilicon, so as to form the intrinsic polysilicon layer 132 and the doped polysilicon layer 133.

(6) RCA cleaning: remove the wraparound $SiO_2$ layer formed on the front side in depositing the mask layer, i.e., the fourth film/layer in step (4), and remove the phosphorosilicate glass (PSG) formed in the annealing step by a continuous-type apparatus for pickling with 22% by volume of HF, then remove the wraparound polysilicon layer on the front side in an alkaline bath, while the N-type doped layer on the back side is protected by the $SiO_2$ mask layer from being damaged. The alkaline liquid in the alkaline bath is sodium hydroxide solution, and a mass concentration of the alkaline liquid is 3.9%. When the wraparound polysilicon layer on the front side is completely removed, remove the BSG on the front side and the mask layer on the back side in a HF bath with 10% by volume of HF.

(7) deposition of an aluminum oxide film and a silicon nitride film on the front side: deposit an aluminum oxide ($Al_2O_3$) thin film as the front passivation layer 122 by PEALD with oxygen gas and trimethylaluminum (TMA) as reactants, and deposit a silicon nitride (SiNx) thin film by PECVD as the anti-reflection layer 123.

(8) deposition of a silicon nitride film on the back side: deposit a SiNx thin film, i.e., the back passivation layer 134 by PECVD for hydrogen passivation for back side films.

(9) form the front electrode 124 and the back electrode 135 by screen printing with slurries on the back side and front side.

(10) carry out photoinjection, efficiency test, and sorting steps.

Example 2

Example 2 is substantially the same as Example 1, except that in step (7), $Al_2O_3$ is deposited by ALD without electric field excitation and with trimethylaluminum (TMA) and water ($H_2O$) as reactants.

Example 3

Example 3 is substantially the same as Example 1, except that in step (4), the thicknesses of the second film/layer and the third film/layer deposited are respectively 40 nm and 80 nm; that is, 40 nm intrinsic amorphous silicon film and 80 nm phosphorus-doped amorphous silicon film are deposited, to increase i/n ratio of poly-Si and reduce the doping concentration.

Example 4

Example 4 is substantially the same as Example 1, except that in step (4), the thickness of the deposited fourth film/layer is 40 nm; that is, the thickness of the $SiO_2$ layer is increased to 40 nm to enhance alkali resistance and better protect the intrinsic polysilicon layer 132 and the doped polysilicon layer 133 on the back side.

Example 5

Example 5 is substantially the same as Example 1, except that in step (4), the deposition of the fourth film/layer, i.e., the $SiO_2$ mask layer, is omitted, and in step (5), the annealing carried out at a temperature of 870° C. for 30 min under oxygen ($O_2$) atmosphere; that is, in the high temperature annealing step, the outer poly-Si is oxidized into $SiO_2$ as a mask layer for protecting the intrinsic polysilicon layer 132 and the doped polysilicon layer 133 on the back side in the subsequent wet etching.

Example 6

Example 6 is substantially the same as Example 1, except that in step (4), the four films are deposited by using the RF power supply with a frequency of 40 kHz for all the four film depositions.

As compared to Example 1, in Example 6, as the frequency of the power supply is reduced, the number of commutations of ion orientation is reduced, the acceleration time of ions is increased, and the deposition speed is increased.

Example 7

Example 7 is substantially the same as Example 1, except that in the step (4), the four films are deposited by using the RF power supply with a frequency of 400 kHz for all the four film depositions.

As compared to Example 1, in Example 7, as the frequency of the power supply is increased, the number of commutations of ion orientation is increased, the acceleration time of ions is decreased, and the deposition speed is lowered, whereas, the valence of ions is higher, the binding energy is increased, and the doping uniformity of the N-type doped polysilicon layer is improved, which is beneficial to the uniformity of the films/layers.

Example 8

Example 8 is substantially the same as Example 1, except that in the step (4), the thickness of the deposited fourth film/layer is 25 nm, with which the acid pickling time for removing the fourth film/layer and that for removing the borosilicate glass layer with the thickness of 120 nm in the subsequent acid pickling are substantially the same, so that both sides can be relatively clean after the acid pickling step.

Comparative Example 1

Comparative Example 1 is substantially the same as Example 1, except that in step (4), the deposition temperature of the first film/layer is 280° C.

Comparative Example 2

Comparative Example 2 is substantially the same as Example 1, except that in step (4), the thickness of the deposited fourth film/layer is 60 nm.

Some key parameters of the TOPCon cells manufactured in respective examples and comparative examples are shown in Table 1 as below.

TABLE 1

| No. | RF power supply | First film/layer | Second film/layer | Third film/layer | Fourth film/layer | Anneal-ing | Front side aluminum oxide |
|---|---|---|---|---|---|---|---|
| Example 1 | 200 KHz | 180° C., thickness of 1.2 nm | 20 nm | 120 nm | 20 nm | $N_2$ | TMA + $O_2$ |
| Example 2 | — | 180° C., thickness of 1.2 nm | 20 nm | 120 nm | 20 nm | $N_2$ | TMA + $H_2O$ |
| Example 3 | 200 KHz | 180° C., thickness of 1.2 nm | 40 nm | 80 nm | 20 nm | $N_2$ | TMA + $O_2$ |
| Example 4 | 200 KHz | 180° C., thickness of 1.2 nm | 20 nm | 120 nm | 40 nm | $N_2$ | TMA + $O_2$ |
| Example 5 | 200 KHz | 180° C., thickness of 1.2 nm | 20 nm | 120 nm | / | $O_2$ | TMA + $O_2$ |
| Example 6 | 40 KHz | 180° C., thickness of 1.2 nm | 20 nm | 120 nm | 20 nm | $N_2$ | TMA + $O_2$ |
| Example 7 | 400 KHz | 180° C., thickness of 1.2 nm | 20 nm | 120 nm | 20 nm | $N_2$ | TMA + $O_2$ |
| Example 8 | 200 KHz | 180° C., thickness of 1.2 nm | 20 nm | 120 nm | 25 nm | $N_2$ | TMA + $O_2$ |
| Comparative Example 1 | 200 KHz | 280° C., thickness of 1.2 nm | 20 nm | 120 nm | 20 nm | $N_2$ | TMA + $O_2$ |
| Comparative Example 2 | 200 KHz | 180° C., thickness of 1.2 nm | 20 nm | 120 nm | 60 nm | $N_2$ | TMA + $O_2$ |

The performance test is described below.

The TOPCon cells manufactured in respective examples and comparative examples are subjected to the performance test using the halm test platform, with the following test conditions: irradiance 1000 W/m², spectrum AM1.5, temperature 25° C. The results are shown in Table 2 as below, wherein Voc denotes open-circuit voltage (V).

TABLE 2

| No. | Photoelectric conversion efficiency Eta | Voc(mV) | Total number of cells (pieces) | Number of qualified cells (pieces) | Yield |
|---|---|---|---|---|---|
| Example 1 | 24.540% | 715.64 | 1995 | 1907 | 95.59% |
| Example 2 | 24.532% | 715.52 | 1984 | 1863 | 93.90% |
| Example 3 | 24.543% | 715.45 | 2000 | 1929 | 96.45% |
| Example 4 | 24.536% | 714.83 | 2000 | 1936 | 96.80% |
| Example 5 | 24.512% | 713.61 | 1992 | 1888 | 94.78% |
| Example 6 | 24.524% | 714.24 | 1995 | 1876 | 94.04% |
| Example 7 | 24.549% | 716.82 | 2000 | 1931 | 96.55% |
| Example 8 | 24.540% | 716.45 | 2000 | 1933 | 96.65% |
| Comparative Example 1 | 24.486% | 712.88 | 1970 | 1788 | 90.76% |
| Comparative Example 2 | 24.502% | 713.25 | 1988 | 1874 | 94.27% |

As can be seen from the above table, according to the embodiments of the present application, the four deposition steps including the PEALD deposition of the tunnel oxide layer (the $SiO_2$ thin film) and the PECVD depositions of the intrinsic polysilicon layer (i-poly-Si), the phosphorus-doped polysilicon layer (n⁺-poly-Si), and the back $SiO_2$ mask layer are performed in one tube of one tubular deposition device, thereby simplifying the process to manufacture the cells. The photoelectric conversion efficiency is above 24.5%, and the open-circuit voltage is above 710 mV. In addition, as compared to Comparative Examples 1 and 2, the yield is significantly increased while the relatively high photoelectric conversion efficiency and open-circuit voltage are ensured.

In Comparative Example 1, the deposition temperature of the first film/layer in step (4) is controlled to be relatively high. As the first film/layer is deposited by the PEALD deposition method, the oxygen gas introduced to the furnace tube is ionized into ozone, and such degradation would be accelerated when the temperature is higher than 200° C., which makes the oxygen source insufficient, and thus the deposited tunnel oxide layer cannot have a stable $SiO_2$ structure, thereby worsening the passivation performance and affecting the photoelectric conversion efficiency and the open-circuit voltage of the cell.

In Comparative Example 2, the thickness of the deposited fourth film/layer in step (4) is controlled to be relatively large. As the thickness of the fourth film/layer is over large, on the one hand, the crystallization speed in the annealing step may be affected, so that intrinsic amorphous silicon and doped amorphous silicon may fail to be completely transformed into polysilicon, and on the other hand, inadequate cleaning by RCA may be induced, which may increase the back side resistance of the cell, thereby affecting the carrier mobility.

Besides, the thickness of the deposited fourth film/layer should not be too small, otherwise the third film/layer will not be well protected, which may cause the third film/layer to be corroded in the process of removing the wraparound polysilicon and PSG from the front side, thereby affecting the photoelectric conversion efficiency and the open-circuit voltage of the cell.

The technical features of the above-described embodiments can be combined arbitrarily. To simplify the description, not all possible combinations of the technical features in the above embodiments are described. However, all of the combinations of these technical features should be considered as being fallen within the scope of the present application, as long as such combinations do not contradict with each other.

The foregoing embodiments merely illustrate some embodiments of the present application, and descriptions thereof are relatively specific and detailed. However, it should not be understood as a limitation to the patent scope of the present application. It should be noted that, a person of ordinary skill in the art may further make some variations and improvements without departing from the concept of the present application, and the variations and improvements falls in the protection scope of the present application. Therefore, the protection scope of the present application shall be subject to the appended claims. The description and accompanying drawings can be used to explain the content of the claims.

What is claimed is:

1. A method for manufacturing a TOPCon cell, comprising the following steps:

texturing a front side of an N-type silicon wafer and then preparing a PN junction;

forming a tunnel oxide layer, an intrinsic polysilicon layer, a doped polysilicon layer, and a silicon oxide mask layer in sequence on a back side of the silicon wafer, wherein forming the intrinsic polysilicon layer and the doped polysilicon layer also results in formation of a wraparound polysilicon layer material on the front side of the silicon wafer, and forming the silicon oxide mask layer also results in formation of a wraparound silicon oxide mask layer material on the front side of the silicon wafer, wherein the tunnel oxide layer is deposited by PEALD at a deposition temperature of 150° C. to 200° C., the doped polysilicon layer is deposited by PECVD, and the silicon oxide mask layer has a thickness of 10 nm to 40 nm;

removing the wraparound silicon oxide mask layer material and the wraparound polysilicon layer material from the front side of the silicon wafer, and then removing the silicon oxide mask layer from the back side; and forming a front electrode on the PN junction and a back electrode on the doped polysilicon layer, respectively.

2. The method of claim 1, wherein the intrinsic polysilicon layer is deposited by PECVD.

3. The method of claim 2, wherein the tunnel oxide layer, the intrinsic polysilicon layer, and the doped polysilicon layer are formed by depositing the tunnel oxide layer, an intrinsic amorphous silicon film, and a doped amorphous silicon film in sequence in a same deposition chamber of a same tubular deposition device, and then annealing the same.

4. The method of claim 1, wherein the intrinsic polysilicon layer and the silicon oxide mask layer are deposited by PECVD.

5. The method of claim 4, wherein the tunnel oxide layer, the intrinsic polysilicon layer, the doped polysilicon layer, and the silicon oxide mask layer are formed by depositing the tunnel oxide layer, an intrinsic amorphous silicon film, a doped amorphous silicon film, and the silicon oxide mask layer in sequence in a same deposition chamber of a same tubular deposition device, and then annealing the same.

6. The method of claim 5, wherein the annealing is performed at 600° C. to 1000° C. for 10 min to 60 min under a nitrogen or oxygen atmosphere.

7. The method of claim 4, wherein the silicon oxide mask layer is deposited by introducing $SiH_4$ and $N_2O$ as reactant sources, a flow rate ratio of $SiH_4$ to $N_2O$ is 1:6 to 1:10, and a deposition temperature is 350° C. to 500° C.

8. The method of claim 1, wherein the step of forming the intrinsic polysilicon layer, the doped polysilicon layer, and the silicon oxide mask layer comprises:

depositing an intrinsic amorphous silicon film and a doped amorphous silicon film in sequence on the tunnel oxide layer by PECVD, and then annealing the same under an oxygen atmosphere to transform the intrinsic amorphous silicon film into the intrinsic polysilicon layer and to transform an inner layer and an outer layer of the doped amorphous silicon film respectively into the doped polysilicon layer and the silicon oxide mask layer;

wherein the annealing is performed at 600° C. to 1000° C. for 10 min to 60 min.

9. The method of claim 8, wherein the intrinsic amorphous silicon film is deposited by introducing a carrier gas and $SiH_4$, a flow rate ratio of $SiH_4$ to the carrier gas is 1:6 to 1:8, and a deposition temperature is 350° C. to 500° C.

10. The method of claim 8, wherein the doped amorphous silicon film is deposited by introducing a carrier gas, $SiH_4$, and $PH_3$, a flow rate ratio of $SiH_4$ to $PH_3$ to the carrier gas is 1:(2 to 3):(4 to 6), and a deposition temperature is 350° C. to 500° C.

11. The method of claim 1, wherein the tunnel oxide layer is deposited by introducing an organosilicone source and oxygen gas as reactant sources, a flow rate ratio of the organosilicone source to the oxygen gas is 1:2 to 1:3, and a deposition pressure is 100 Pa to 150 Pa.

12. The method of claim 1, wherein a thickness of the tunnel oxide layer is 0.5 nm to 2 nm; a thickness of the intrinsic polysilicon layer is 10 nm to 50 nm; and a thickness of the doped polysilicon layer is 80 nm to 150 nm.

13. The method of claim 1, wherein the silicon oxide mask layer on the back side is removed by acid pickling with an acid liquid, and the acid liquid is hydrofluoric acid with a volume percent of 8 to 15.

14. The method of claim 13, wherein the PN junction is prepared by boron diffusion during which a boron-doped silicon layer is formed in the silicon wafer, and a borosilicate glass layer is formed on a surface of the boron-doped silicon layer; the borosilicate glass layer is removed simultaneously removing the silicon oxide mask layer from the back side;

a thickness of the borosilicate glass layer formed on the surface of the PN junction is 100 nm to 120 nm;

a thickness of the silicon oxide mask layer is 20 nm to 30 nm.

15. The method of claim 1, wherein the wraparound silicon oxide mask layer material on the front side of the silicon wafer is removed by acid pickling with an acid liquid, and the acid liquid is hydrofluoric acid with a volume percent of 10 to 40.

16. The method of claim 12, wherein the step of removing the wraparound polysilicon layer material from the front side of the silicon wafer is performed after removing the wraparound silicon oxide mask layer material from the front side of the silicon wafer;

the wraparound polysilicon layer material on the front side of the silicon wafer is removed by alkaline pickling with an alkaline liquid, the alkaline liquid is a solution containing sodium hydroxide, potassium hydroxide, or a combination thereof, and a mass concentration of the alkaline liquid is 3% to 6%.

17. The method of claim 1, further comprising a step of forming a front passivation layer and an anti-reflection layer in sequence on the PN junction before the step of forming the front electrode on the PN junction;

the front passivation layer is an aluminum oxide film, and the anti-reflection layer is a silicon nitride film.

18. The method of claim 1, further comprising a step of forming a back passivation layer on the doped polysilicon layer before the step of forming the back electrode on the doped polysilicon layer;

the back passivation layer is a silicon nitride film.

* * * * *